United States Patent [19]

Sato

[11] Patent Number: 4,485,350

[45] Date of Patent: Nov. 27, 1984

[54] VARIABLE ELECTRONIC IMPEDANCE CIRCUIT

[75] Inventor: Tetsuo Sato, Takasaki, Japan

[73] Assignee: Hitachi, Ltd., Tokyo, Japan

[21] Appl. No.: 384,717

[22] Filed: Jun. 2, 1982

[30] Foreign Application Priority Data

Aug. 26, 1981 [JP] Japan .................... 56/132764

[51] Int. Cl.³ ............................................. H03F 1/34
[52] U.S. Cl. ......................................... 330/86; 307/264; 330/110; 330/284
[58] Field of Search .............. 330/51, 86, 110, 282, 330/297; 307/264

[56] References Cited

FOREIGN PATENT DOCUMENTS 122348 10/1978 Japan .................................. 330/51

Primary Examiner—James B. Mullins
Attorney, Agent, or Firm—Antonelli, Terry & Wands

[57] ABSTRACT

A variable electronic impedance circuit is constructed of a voltage-current converter whose input terminal is supplied with an input signal voltage, and a variable-gain current amplifier whose input terminal is supplied with an output current of the voltage-current converter and whose output signal current is fed back to the input terminal of the voltage-current converter.

In order to prevent the undesirable oscillation phenomenon of the variable electronic impedance circuit immediately after the closure of a power supply, a control circuit which operates for a predetermined time after the closure of the power supply is especially arranged.

Since an output signal from the control circuit inhibits the operation of the variable-gain current amplifier during the predetermined time, the unstable operation immediately after the closure of the power supply can be prevented.

11 Claims, 1 Drawing Figure

VARIABLE ELECTRONIC IMPEDANCE CIRCUIT

Background of the Invention

The present invention relates to a variable electronic impedance circuit which can be used for the recording/playback amplifier of a magnetic tape recording/playback system, a noise reduction circuit, etc.

An example of a prior-art variable electronic impedance circuit is disclosed in U.S. Pat. No. 4,220,875 to Lawton, issued Sept. 2, 1980. It has been revealed by the inventor's study that, in the variable impedance circuit of this type, a radio frequency signal develops in particular immediately after the closure of the power supply, for causing disturbance in the radio receiver or distortion of the output signal. Since such variable electronic impedance circuit is of the current feedback type, the aforementioned disadvantage is thought to be caused by an oscillation phenomenon ascribable to a positive feedback taking place immediately after the closure of the power supply.

Summary of the Invention

The present invention has been made from the viewpoint of solving the problem as stated above, and has for its object to provide a variable electronic impedance circuit which prevents an unstable operation immediately after the turn-on of the supply voltage.

Brief Description of the Drawing

The drawing illustrates an embodiment of the present invention, and the single FIGURE is a circuit diagram showing a variable electronic impedance circuit adopting the present invention and an example of the application thereof.

Description of the Preferred Embodiment

Figure 1:
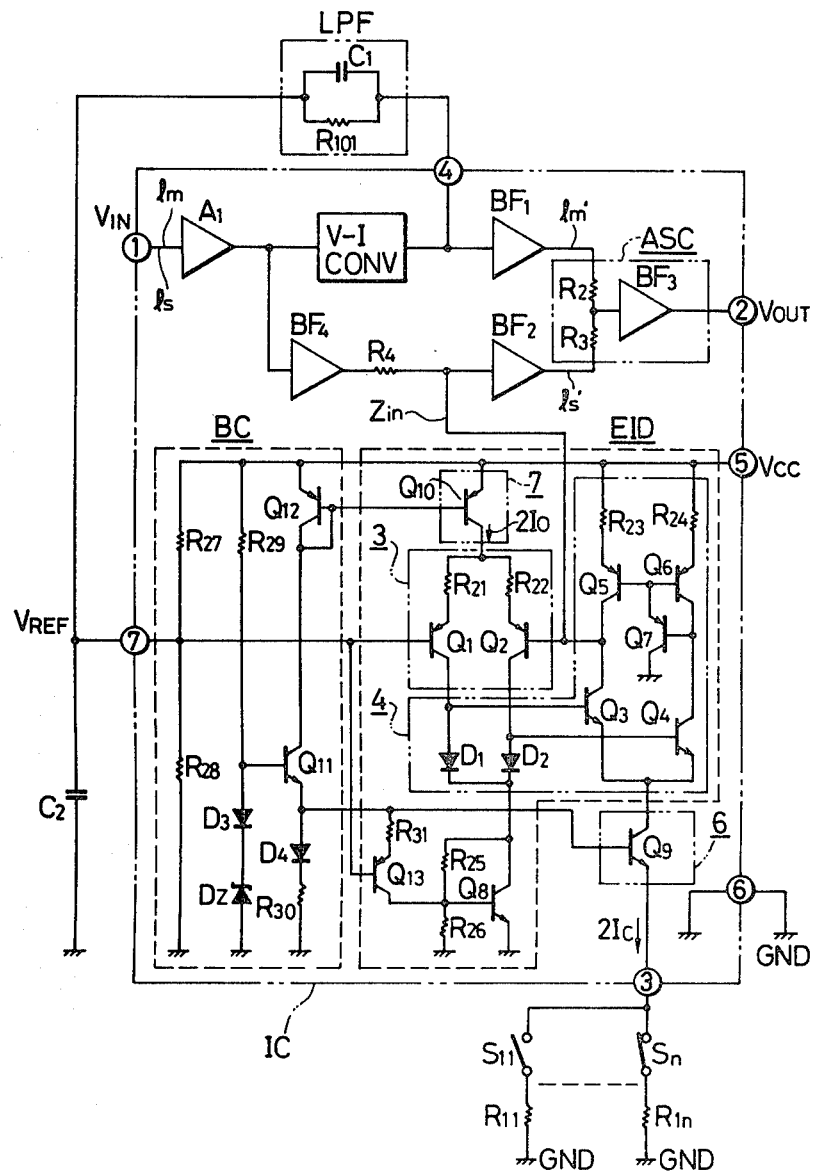

Now, an embodiment of an electronic impedance device applying in accordance with the present invention will be described with reference to the single FIGURE. In an integrated circuit (hereinbelow, abbreviated to "IC") shown in the FIGURE, the electronic impedance device and a signal processing circuit are constructed as will be stated later, but the combination of such circuits is not especially restricted.

First, there will be described the circuit arrangement of the electronic impedance device EID constructed within the IC. The electronic impedance device EID is constructed of a voltage-current converter 3 having a high input impedance, a variable-gain current amplifier 4, a variable constant current source 6 and a constant current source 7, and further, a transistor $Q_8$ for producing a predetermined bias voltage, a transistor $Q_{13}$ adapted to perform on-off operations in correspondence with the voltage levels of terminal No. 7, etc. The transistor $Q_{13}$ operates as a control circuit which, in effect, inhibits the feedback operation of the variable electronic impedance device for a predetermined time after the closure of a power supply.

The voltage-current converter 3 is constructed of P-N-P transistors $Q_1$ and $Q_2$ and semiconductor diffused resistors $R_{21}$ and $R_{22}$. Changes in the collector currents of the respective P-N-P transistors $Q_1$ and $Q_2$ are detected by the variable-gain current amplifier 4 of the succeeding stage, in other words, N-P-N transistors $Q_3$ and $Q_4$. The variable-gain current amplifier 4 is constructed of diodes $D_1$ and $D_2$ and the N-P-N transistors $Q_3$ and $Q_4$, and further, P-N-P transistors $Q_5$, $Q_6$ and $Q_7$ and semiconductor diffused resistors $R_{23}$ and $R_{24}$ which are connected as a current mirror circuit. A feedback connection between the output of the variable-gain current amplifier 4 and the input of the voltage-current converter 3 is provided by a connection between the collector of transistor $Q_3$ and the base of transistor $Q_2$. The input impedance $Z_{in}$ of the electronic impedance device EID (in other words, the impedance of the node between the base of the transistor $Q_2$ and the collectors of the respective transistors $Q_3$ and $Q_5$) is varied by controlling the value of a constant current which flows through the collector-emitter path of a transistor $Q_9$ forming the variable constant current source 6. This control of the constant current is made, depending upon which of the resistors $R_{11}$-$R_{1n}$ is connected to terminal No. 3.

On the other hand, a bias circuit BC is constructed of semiconductor diffused resistors $R_{27}$, $R_{28}$, $R_{29}$ and $R_{30}$, an N-P-N transistor $Q_{11}$ and a P-N-P transistor $Q_{12}$, and further, diodes $D_3$ and $D_4$ and a Zener diode $D_z$. It can produce a desired bias voltage. The node between the resistors $R_{27}$ and $R_{28}$ is connected through terminal No. 7 to an external capacitance $C_2$ for removing the ripple component of a supply voltage, and is grounded A.C.-wise. In addition, the resistors $R_{27}$ and $R_{28}$ have substantially equal resistances. Accordingly, a reference voltage $V_{REF}$ which is substantially $\frac{1}{2}V_{CC}$ D.C.-wise is obtained from the node of the resistors $R_{27}$ and $R_{28}$. This reference voltage $V_{REF}$ is fed to one end of a low-pass filter LPF (hereinbelow, simply termed "LPF") and the base of the transistor $Q_1$.

Next, an example of the signal processing circuit formed between terminals No. 1 and No. 2 will be explained. This signal processing circuit is an amplifier which is used in a magnetic tape recording/playback system, and which is so constructed that the playback compensations of frequency characteristics can be made in correspondence with the kinds of magnetic tapes and the traveling speeds of the tapes. Hereunder, the signal processing circuit will be outlined. A playback signal $V_{in}$ is transmitted from, for example, a recording/playback head (not shown) to terminal No. 1, and then to a main path $l_m$-$l_m'$ and a side path $l_s$-$l_s'$. An amplifier $A_1$ has a substantially flat frequency characteristic.

A voltage-current converter V-$I_{conv}$ incorporated in the main path serves to compensate for the frequency characteristic in association with the LPF. A circuit $BF_1$ is a buffer amplifier which is constructed of, for example, an emitter follower circuit. Circuits $BF_4$ and $BF_2$ incorporated in the side path are buffer amplifiers each of which is constructed of, for example, an emitter follower circuit, and a semiconductor diffused resistor $R_4$ is disposed therebetween. This resistor $R_4$ controls the gain of the side path $l_s$-$l_s'$ in association with the input impedance $Z_{in}$ of the electronic impedance device EID. Semiconductor diffused resistors $R_2$ and $R_3$ have substantially equal resistances, and these resistors $R_2$ and $R_3$ and a buffer amplifier $BF_3$ constructed of, for example, an emitter follower circuit constitute an analog summation circuit ASC.

Now, the circuit operations of the electronic impedance device constructed as stated above will be described.

First, there will be explained the circuit operations immediately after the supply voltage $V_{CC}$ has been fed to terminal No. 5.

In this case, the reference voltage $V_{REF}$ generated at terminal No. 7 does not rise to $\frac{1}{2}V_{CC}$ on account of current which flows via the resistor $R_{27}$ through the capacitance $C_2$ for removing the ripple of the supply voltage. In accordance with the time constant between the resistor $R_{27}$ and the capacitance $C_2$, the base voltage of the transistors $Q_1$ and $Q_{13}$ rises gradually.

Immediately after the closure of the power supply, current flows through the resistor $R_{29}$, the diode $D_3$ and the Zoner diode $D_z$, so that a predetermined emitter voltage is produced at the emitter of the transistor $Q_{11}$. Thus, the predetermined emitter voltage is fed to the base of the transistor $Q_9$ as a bias voltage immediately after the closure of the power supply.

To be noted is the operation of the transistor $Q_{13}$. The aforementioned emitter voltage of the transistor $Q_{11}$ is fed to the emitter of the transistor $Q_{13}$ through a resistor $R_{31}$. Since, at this point of time, the base voltage of the transistor $Q_{13}$ is at a low level as stated above, this transistor $Q_{13}$ falls into the "on" state. Accordingly, the transistor $Q_8$ falls into the "on" state, and the cathodes of the diodes $D_1$ and $D_2$ become substantially ground potential.

On the other hand, the anode-cathode voltages of the silicon diodes $D_1$ and $D_2$ are substantially equal to the base-emitter voltages of the transistors $Q_3$ and $Q_4$. Therefore, the collector of the transistor $Q_9$ becomes ground potential, and this transistor $Q_9$ falls into the "off" state.

Thus, since the transistor $Q_9$ is in the "off" state as described above, no current flows through the path of terminal No. 5 → terminal No. 3 → a switch $S_n$ → the resistor $R_{1n}$ → the ground potential GND. That is, owing to the turn-on of the transistor $Q_{13}$, the transistor $Q_9$ falls into the "off" state, and the transistors $Q_3$ and $Q_4$ of the variable-gain current amplifier 4 are brought into the non-operating state. Meantime, even when a change has occurred in current flowing through the transistor $Q_1$ or $Q_2$, the electrical interference in which the current change of one transistor is fed back to the other transistor does not take place, at least, through the transistors $Q_3$ and $Q_4$. Accordingly, a radio frequency signal, an electrical noise or the like does not develop from the electronic impedance device.

In the next place, there will be explained the circuit operations in the case where the reference voltage $V_{REF}$ at terminal No. 7 has risen substantially to $\frac{1}{2}V_{CC}$.

When the reference voltage $V_{REF}$ has risen to $\frac{1}{2}V_{CC}$, the base voltage of the transistor $Q_{13}$ becomes higher in level than the emitter voltage thereof. Accordingly, the transistor $Q_{13}$ falls into the "off" state, and therewith, the emitter voltage of the transistor $Q_{11}$ is fed to the base of the transistor $Q_9$ as a bias voltage. As a result, current flows along terminal No. 5 → terminal No. 3 → the switch $S_n$ → the resistor $R_{1n}$ → the ground potential GND, and there is established the state in which the electronic impedance device EID can perform its normal operation. That is, owing to the turn-on of the transistor $Q_9$, changes in the collector currents of the respective transistors $Q_1$ and $Q_2$ are detected by the transistors $Q_3$ and $Q_4$. The base current of the transistor $Q_2$ is controlled by the operation of the current mirror circuit $Q_5$, $Q_6$. Such operations of the electronic impedance device EID change the input impedance $Z_{in}$, and control the gain of the side path $l_s-l_s'$.

Here, the input impedance $Z_{in}$ of the electronic impedance device EID will be reviewed. In case the resistors $R_{21}$ and $R_{22}$ are set at resistances equal to each other, the input impedance $Z_{in}$ is given by:

$$Z_{in} = \frac{re_2 + R_{22}}{rd_2} \cdot re_4 \quad (1)$$

$$re_2 = rd_2 = \frac{KT}{qI_o} \quad (2)$$

$$re_4 = \frac{KT}{qI_c} \quad (3)$$

In the aforementioned expressions (1)–(3), $re_2$ denotes the base-emitter junction resistance of the transistor $Q_2$, $rd_2$ the dynamic resistance of the diode $D_2$, $re_4$ the base-emitter junction resistance of the transistor $Q_4$, K the Boltzmann constant, T the absoluble temperature, q the electronic charge, $I_o$ the value of half of the constant current flowing through the collector-emitter path of the transistor $Q_{10}$, and $I_c$ the value of half of the constant current flowing through the collector-emitter path of the transistor $Q_9$. From Expressions (1)–(3), the following is obtained:

$$Z_{in} = \frac{\frac{KT}{qI_o} + R_{22}}{\frac{KT}{qI_o}} \cdot \frac{KT}{qI_c} \quad (4)$$

The dynamic resistances $re_2$ and $rd_2$ become small values which are negligible as compared with the resistance $R_{22}$. Accordingly, Expression (4) is approximately reduced to:

$$Z_{in} \approx R_{22} \cdot \frac{I_o}{I_c} \quad (5)$$

In addition, the potential difference across the silicon diode $D_3$ or $D_4$ and the potential difference across the base and emitter of the silicon transistor $Q_9$ or $Q_{11}$ become substantially equal to the forward voltage $V_F$ of a P-N junction. Accordingly, the constant current 2 $I_o$ which flows through the collector-emitter path of the transistor $Q_{10}$ being the constant current source 7 is given by:

$$2I_o = \frac{V_z - V_F}{R_{30}} \quad (6)$$

where $V_z$ denotes the Zener voltage of the Zener diode $D_z$. Further, the constant current 2 $I_c$ which flows through the collector-emitter path of the transistor $Q_9$ being the variable current source 6 during the closure of the switch $S_n$ is given by:

$$2I_c = \frac{V_z - V_F}{R_{1n}} \quad (7)$$

Substituting Expressions (6) and (7) into Expression (5), $$Z_{in} = \frac{R_{22}}{R_{30}} \cdot R_{1n} \quad (8)$$

The resistors $R_{22}$ and $R_{23}$ have temperature-dependencies equal to each other and deviations equal to each other due to a manufacturing process, and as the external resistor $R_{1n}$, one precise resistance exhibiting a very low temperature-dependency can be selected. Accordingly, the temperature-dependency and error of the input impedance $Z_{in}$ can be made very small.

According to the present invention, therefore, the feedback operation of the variable impedance device is substantially inhibited immediately after the closure of a power supply, so that the unstable operation immediately after the power supply has been closed can be prevented and that neither an undesirable radio frequency signal nor an electrical noise etc. will develop.

What is claimed is

1. A variable electronic impedance circuit comprising:
    (a) voltage-current converter having an input terminal which is supplied with an input signal voltage;
    (b) a variable-gain current amplifier having an input terminal which is connected to receive an output current of said voltage-current converter, and including feedback means for feeding an output signal current of said variable-gain current amplifier to said input terminal of said voltage-current converter;
    (c) a power supply circuit for supplying operating power to said voltage-current converter and said variable-gain current amplifier;
    (d) means coupled to said variable-gain current amplifier for controlling the impedance at said input terminal of said voltage-current converter; and
    (e) control means for inhibiting said feedback means for a predetermined period of time after closure of said power supply circuit.

2. A variable electronic impedance circuit according to claim 1, further comprising:
    (f) a first bias circuit which feeds one input terminal of said control means with a first bias voltage that rises according to a predetermined time constant, after the closure of said power supply circuit; and
    (g) a second bias circuit which feeds another input terminal of said control means with a predetermined second bias voltage immediately after the closure of said power supply circuit.

3. A variable electronic impedance circuit according to claim 2, wherein the predetermined time constant is determined by the capacitance of a capacitor in said first bias circuit for removing a ripple of the power supply circuit, and the predetermined second bias voltage is determined by the Zener voltage of a Zener diode in said second bias circuit.

4. A variable electronic impedance circuit according to claim 3, wherein said control means includes means for inhibiting the operation of said variable-gain current amplifier for said predetermined period of time after the closure of the power supply circuit.

5. A variable electronic impedance circuit according to claim 1, wherein said means for controlling the impedance at said input terminal comprises a variable constant current source.

6. A variable electronic impedance circuit according to claim 1, wherein said control means comprises means responsive to said power supply circuit for disabling said variable-gain current amplifier when the voltage of said power supply circuit is less than a predetermined value.

7. A variable electronic impedance circuit according to claim 1, wherein said means for controlling the impedance at said input terminal comprises a variable constant current source connected to said variable-gain current amplifier across said power supply circuit, and said control means comprises means responsive to said power supply circuit for disabling said variable constant current source when the voltage of said power supply circuit is less than a predetermined value.

8. A variable electronic impedance circuit comprising:
    (a) a voltage-current converter having an input terminal which is supplied with an input signal voltage;
    (b) a variable-gain current amplifier having an input terminal which is supplied with the output current of said voltage-current converter;
    (c) a feedback loop connecting the output of said variable-gain current amplifier to said input terminal of said voltage-current converter so as to form a closed loop comprising said voltage-current converter, said variable gain current amplifier and said feedback loop;
    (d) a variable constant current source coupled to said variable-gain current amplifier for controlling an impedance at said input terminal of said voltage-current converter;
    (e) a power supply circuit for supplying operating power to said voltage-current converter and said variable gain current amplifier; and
    (f) control means for inhibiting the signal transmitting operation within said closed loop for a predetermined period of time after closure of said power supply circuit.

9. A variable electronic impedance circuit according to claim 8, further comprising:
    (g) a first bias circuit which feeds one input terminal of said control means with a first bias voltage that rises according to a predetermined time constant, after the closure of said power supply circuit; and
    (h) a second bias circuit which feeds another input terminal of said control means with a predetermined second bias voltage immediately after the closure of said power supply circuit.

10. A variable electronic impedance circuit according to claim 9, wherein said predetermined time constant is determined by the capacitance of a capacitor for removing a ripple of the power supply circuit, and the predetermined second bias voltage is determined by the Zener voltage of a Zener diode.

11. A variable electronic impedance circuit according to claim 10, wherein said control means includes means for inhibiting the operation of said variable-gain current amplifier for the predetermined period of time after the closure of said power supply circuit.

* * * * *